(12) United States Patent
Kim et al.

(10) Patent No.: US 10,964,527 B2
(45) Date of Patent: Mar. 30, 2021

(54) RESIDUAL REMOVAL

(71) Applicant: Applied Materials, Inc., Santa Clara, CA (US)

(72) Inventors: Jong Mun Kim, San Jose, CA (US); Biao Liu, San Jose, CA (US); Cheng Pan, San Jose, CA (US); Erica Chen, Cupertino, CA (US); Chentsau Ying, Cupertino, CA (US); Srinivas Nemani, Sunnyvale, CA (US); Ellie Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/401,883

(22) Filed: May 2, 2019

(65) Prior Publication Data
US 2019/0393024 A1 Dec. 26, 2019

Related U.S. Application Data

(60) Provisional application No. 62/688,159, filed on Jun. 21, 2018.

(51) Int. Cl.
*H01L 21/02* (2006.01)
*H01L 21/3105* (2006.01)
*H01L 21/311* (2006.01)

(52) U.S. Cl.
CPC .... *H01L 21/0206* (2013.01); *H01L 21/02142* (2013.01); *H01L 21/02175* (2013.01); *H01L 21/02178* (2013.01); *H01L 21/02181* (2013.01); *H01L 21/02183* (2013.01); *H01L 21/02186* (2013.01); *H01L 21/02189* (2013.01); *H01L 21/02192* (2013.01); *H01L 21/31053* (2013.01); *H01L 21/31122* (2013.01)

(58) Field of Classification Search
None
See application file for complete search history.

(56) References Cited

U.S. PATENT DOCUMENTS

| | | | |
|---|---|---|---|
| 6,905,972 | B2 | 6/2005 | Oda |
| 7,055,263 | B2 | 6/2006 | Wu et al. |
| 7,097,716 | B2 | 8/2006 | Barnes et al. |
| 7,270,761 | B2 | 9/2007 | Wang et al. |
| 9,040,422 | B2 | 5/2015 | Wang et al. |
| 2004/0011380 | A1 | 1/2004 | Ji et al. |
| 2011/0244680 | A1 | 10/2011 | Tohnoe et al. |
| 2013/0087174 | A1 | 4/2013 | Sun et al. |

(Continued)

FOREIGN PATENT DOCUMENTS

TW 201203369 A 1/2012

OTHER PUBLICATIONS

Office Action for Taiwan Patent Application No. 108117964 dated Feb. 27, 2020.

(Continued)

*Primary Examiner* — Roberts P Culbert
(74) *Attorney, Agent, or Firm* — Patterson + Sheridan, LLP

(57) ABSTRACT

Methods for removing residuals after a selective deposition process are provided. In one embodiment, the method includes performing a selective deposition process to form a metal containing dielectric material at a first location of a substrate and performing a residual removal process to remove residuals from a second location of the substrate.

19 Claims, 5 Drawing Sheets

(56) References Cited

U.S. PATENT DOCUMENTS

2015/0228495 A1* 8/2015 Joubert ............ H01L 21/31116
438/714
2018/0012752 A1 1/2018 Tapily

OTHER PUBLICATIONS

International Search Report and Written Opinion for PCT/US2019/030742 dated Aug. 20, 2019.

* cited by examiner

RESIDUAL REMOVAL

CROSS-REFERENCE TO RELATED APPLICATIONS

This application claims benefit of U.S. Provisional Application Ser. No. 62/688,159 filed Jun. 21, 2018, which is incorporated by reference in its entirety.

BACKGROUND

Field

Embodiments generally relate to methods for removing defects from a substrate on certain locations of a semiconductor substrate. More specifically, embodiments relate to methods for selectively forming desired materials on a substrate with different materials at different locations of the substrate by a selective deposition process utilizing localized passivation deposition.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As the geometry limits of the structures used to form semiconductor devices are pushed against technology limits, the need for accurate formation with desired materials for the manufacture of structures having small critical dimensions and high aspect ratios and structures with different materials has become increasingly difficult to satisfy. Conventional methods for selective deposition may be performed to locally form a material layer on only certain locations of a planer surface on a substrate made from a material different than the substrate material. However, as the geometry limits of the structures continue to push, the selective deposition process may not be efficiently confined and formed at the designated small dimensions on the substrate, resulting in undesired materials formed on the undesired locations of the substrate. Furthermore, some residual materials are often formed on undesired locations when the selectivity of the deposition process is not sufficiently high. Such residual materials remain on the undesired locations may contaminate the device structures on the substrate, downgrading the electrical performance of the device and eventually leading to device failure.

Thus, there is a need for improved methods for removing residuals after a selective deposition process suitable for advanced generation of semiconductor chips or other semiconductor devices.

SUMMARY

Embodiments of the present disclosure provide methods for removing residuals from undesired locations on a substrate in semiconductor applications. In one embodiment, the method includes performing a selective deposition process to form a metal containing dielectric material at a first location of a substrate and performing a residual removal process to remove residuals from a second location of the substrate.

In another example, a method for removing residuals from a substrate includes performing a selective deposition process to form a metal containing dielectric material on a metal material on a substrate and leaving residuals on a dielectric material on the substrate, wherein the metal containing dielectric material is a high dielectric constant material having a dielectric constant greater than 12, and performing a residual removal process to remove residuals from the substrate.

In yet another example, a method for removing residuals from a substrate includes performing a selective deposition process by an atomic layer deposition process to form a metal containing dielectric material on a metal material on a substrate and leaving residuals on a dielectric material on the substrate, and performing a residual removal process to remove residuals from the substrate wherein the residual has a diameter less than 30 nm but greater than 2 nm.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Methods for removal residuals from a substrate are provided. The methods utilize a chemical mechanical polish process after a selective deposition process to removal residuals from the selective deposition process. Alternatively, the methods utilize an etching process that may selectively remove residuals from undesired locations of the substrate, without damaging or removing the materials formed on the desired locations. After removal of the residuals, an additional chemical mechanical polish process may be optionally performed to removal residuals, if any, from the substrate as needed.

The term "substrate" as used herein refers to a layer of material that serves as a basis for subsequent processing operations and includes a surface to be cleaned. For example, the substrate can include one or more material containing silicon containing materials, IV group or III-V group containing compounds, such as Si, polysilicon, amorphous silicon, Ge, SiGe, GaAs, InP, InAs, GaAs, GaP, InGaAs, InGaAsP, GaSb, InSb and the like, or combinations thereof. Furthermore, the substrate can also include dielectric materials such as silicon dioxide, organosilicates, and carbon doped silicon oxides. The substrate may also include one or more conductive metals, such as nickel, titanium, platinum, molybdenum, rhenium, osmium, chromium, iron, aluminum, copper, tungsten, or combinations thereof. Further, the substrate can include any other materials such as metal nitrides, metal oxides and metal alloys, depending on the application. In one or more embodiments, the substrate can form a contact structure, a metal silicide layer, or a gate structure including a gate dielectric layer and a gate electrode layer to facilitate connecting with an interconnect feature, such as a plug, via, contact, line, and wire, subsequently formed thereon, or suitable structures utilized in semiconductor devices.

Moreover, the substrate is not limited to any particular size or shape. The substrate can be a round wafer having a 200 mm diameter, a 300 mm diameter, a 450 mm diameter or other diameters. The substrate can also be any polygonal, square, rectangular, curved or otherwise non-circular workpiece, such as a polygonal glass, plastic substrate used in the fabrication of flat panel displays.

Figure 1:
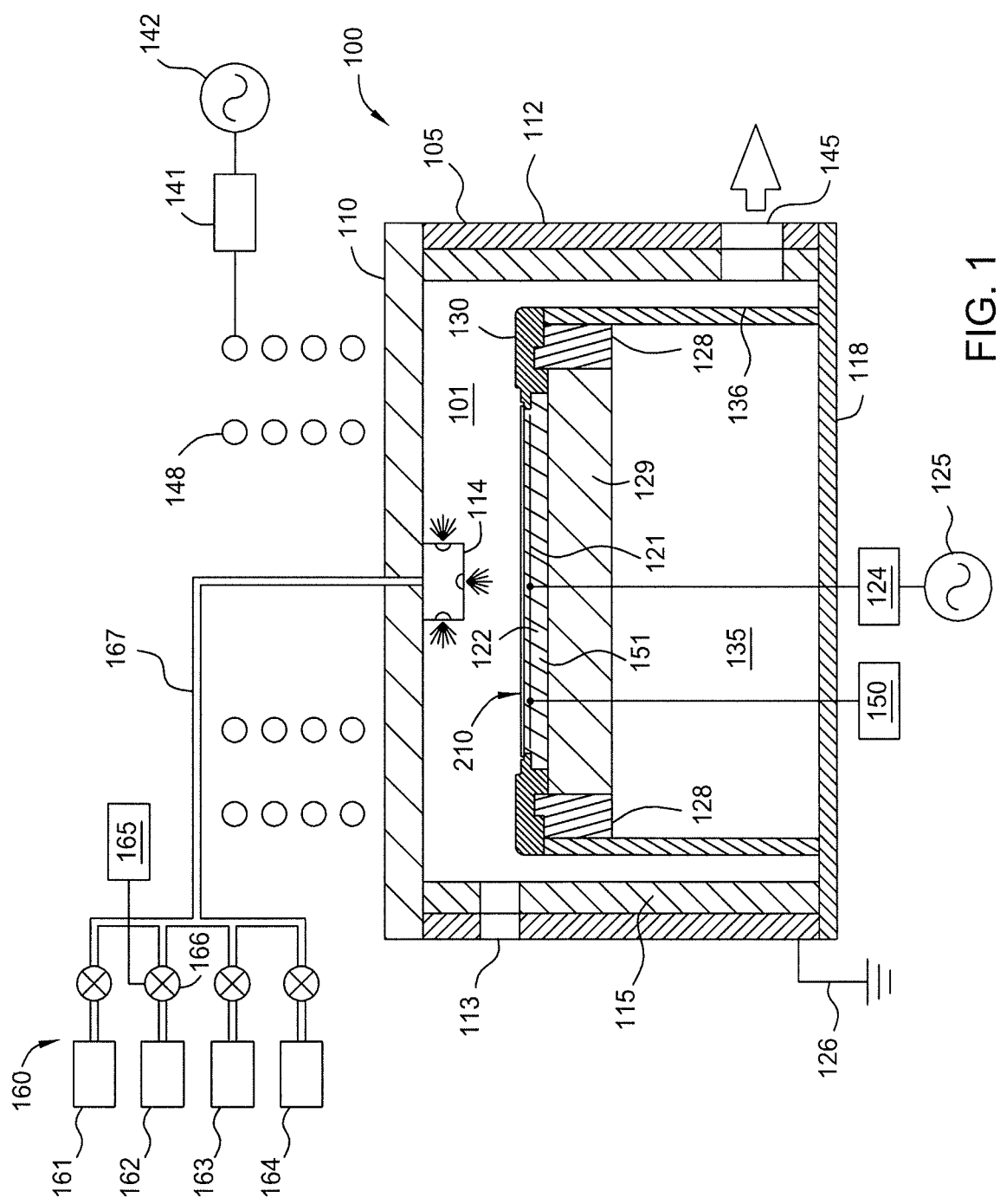
FIG. 1 is a schematic cross-sectional view of a processing chamber configured to perform an etching process according to one or more embodiments of the disclosure.

FIG. 1 is a simplified sectional view for an exemplary processing chamber 100 suitable for etching residuals from a substrate in the processing chamber 100. The exemplary processing chamber 100 is suitable for performing a patterning process. One example of the processing chamber 100 that may be adapted to benefit from the disclosure is an CENTRIS® Sym3™ etching processing chamber, available from Applied Materials, Inc., located in Santa Clara, Calif. It is contemplated that other process chambers, including those from other manufactures, may be adapted to practice embodiments of the disclosure.

The plasma processing chamber 100 includes a chamber body 105 having a chamber volume 101 defined therein. The chamber body 105 has sidewalls 112 and a bottom 118 which are coupled to ground 126. The sidewalls 112 have a liner 115 to protect the sidewalls 112 and extend the time between maintenance cycles of the plasma processing chamber 100. The dimensions of the chamber body 105 and related components of the plasma processing chamber 100 are not limited and generally are proportionally larger than the size of the substrate 210 to be processed therein. Examples of substrate sizes include 200 mm diameter, 250 mm diameter, 300 mm diameter and 450 mm diameter, among others.

The chamber body 105 supports a chamber lid assembly 110 to enclose the chamber volume 101. The chamber body 105 may be fabricated from aluminum or other suitable materials. A substrate access port 113 is formed through the sidewall 112 of the chamber body 105, facilitating the transfer of the substrate 210 into and out of the plasma processing chamber 100. The access port 113 may be coupled to a transfer chamber and/or other chambers of a substrate processing system (not shown).

A pumping port 145 is formed through the sidewall 112 of the chamber body 105 and connected to the chamber volume 101. A pumping device (not shown) is coupled through the pumping port 145 to the chamber volume 101 to evacuate and control the pressure therein. The pumping device may include one or more pumps and throttle valves.

A gas panel 160 is coupled by a gas line 167 to the chamber body 105 to supply process gases into the chamber volume 101. The gas panel 160 may include one or more process gas sources 161, 162, 163, 164 and may additionally include inert gases, non-reactive gases, and reactive gases, if desired. Examples of process gases that may be provided by the gas panel 160 include, but are not limited to, hydrocarbon containing gas including methane ($CH_4$), sulfur hexafluoride ($SF_6$), carbon tetrafluoride ($CF_4$), hydrogen bromide (HBr), hydrocarbon containing gas, argon gas (Ar), chlorine ($Cl_2$), nitrogen ($N_2$), helium (He) and oxygen gas ($O_2$). Additionally, process gasses may include chlorine, fluorine, oxygen and hydrogen containing gases such as $BCl_3$, $C_2F_4$, $C_4F_8$, $C_4F_6$, $CHF_3$, $CH_2F_2$, $CH_3F$, $NF_3$, $CO_2$, $SO_2$, CO, and $H_2$ among others.

Valves 166 control the flow of the process gases from the sources 161, 162, 163, 164 from the gas panel 160 and are managed by a controller 165. The flow of the gases supplied to the chamber body 105 from the gas panel 160 may include combinations of the gases.

The lid assembly 110 may include a nozzle 114. The nozzle 114 has one or more ports for introducing the process gases from the sources 161, 162, 164, 163 of the gas panel 160 into the chamber volume 101. After the process gases are introduced into the plasma processing chamber 100, the gases are energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 210 and/or above the substrate 221001 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 is disposed in the chamber volume 101 to support the substrate 210 during processing. The substrate support pedestal 135 may include an electrostatic chuck 122 for holding the substrate 301 during processing. The electrostatic chuck (ESC) 122 uses the electrostatic attraction to hold the substrate 210 to the substrate support pedestal 135. The ESC 122 is powered by an RF power supply 125 integrated with a match circuit 124. The ESC 122 comprises an electrode 121 embedded within a dielectric body. The electrode 121 is coupled to the RF power supply 125 and provides a bias which attracts plasma ions, formed by the process gases in the chamber volume 101, to the ESC 122 and substrate 210 positioned thereon. The RF power supply 125 may cycle on and off, or pulse, during processing of the substrate 210. The ESC 122 has an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Furthermore, the electrode 121 is coupled to a power source 150. The power source 150 provides a chucking voltage of about 200 volts to about 2000 volts to the electrode 121. The power source 150 may also include a system controller for controlling the operation of the electrode 121 by directing a DC current to the electrode 121 for chucking and de-chucking the substrate 210.

The ESC 122 may include heaters disposed therein and connected to a power source (not shown), for heating the substrate, while a cooling base 129 supporting the ESC 122 may include conduits for circulating a heat transfer fluid to maintain a temperature of the ESC 122 and substrate 210 disposed thereon. The ESC 122 is configured to perform in the temperature range required by the thermal budget of the device being fabricated on the substrate 210. For example, the ESC 122 may be configured to maintain the substrate 210 at a temperature of about minus about 25 degrees Celsius to about 500 degrees Celsius for certain embodiments.

The cooling base 129 is provided to assist in controlling the temperature of the substrate 210. To mitigate process drift and time, the temperature of the substrate 210 may be maintained substantially constant by the cooling base 129 throughout the time the substrate 210 is in the cleaning chamber. In one embodiment, the temperature of the substrate 210 is maintained throughout subsequent cleaning processes at about 30 to 120 degrees Celsius.

A cover ring 130 is disposed on the ESC 122 and along the periphery of the substrate support pedestal 135. The cover ring 130 is configured to confine etching gases to a desired portion of the exposed top surface of the substrate 210, while shielding the top surface of the substrate support pedestal 135 from the plasma environment inside the plasma processing chamber 100. Lift pins (not shown) are selectively moved through the substrate support pedestal 135 to lift the substrate 210 above the substrate support pedestal 135 to facilitate access to the substrate 210 by a transfer robot (not shown) or other suitable transfer mechanism.

The controller 165 may be utilized to control the process sequence, regulating the gas flows from the gas panel 160 into the plasma processing chamber 100 and other process parameters. Software routines, when executed by the CPU, transform the CPU into a specific purpose computer (controller) that controls the plasma processing chamber 100 such that the processes are performed in accordance with the present disclosure. The software routines may also be stored and/or executed by a second controller (not shown) that is collocated with the plasma processing chamber 100.

Figure 2:
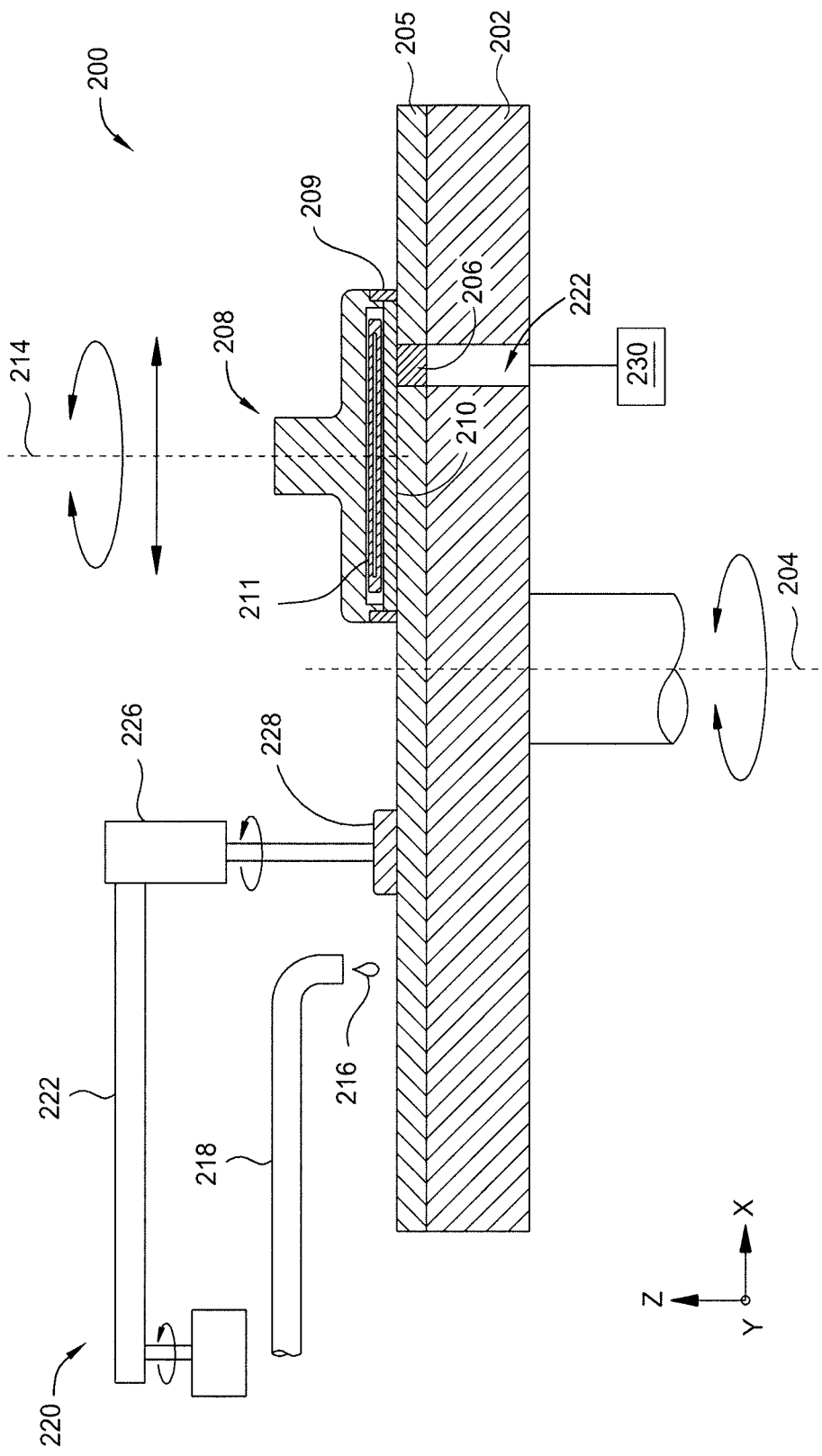
FIG. 2 is a schematic cross-sectional view of a polishing system configured to perform a chemical mechanical polish (CMP) process.

FIG. 2 is a schematic sectional view of an exemplary polishing system 200. Typically, a polishing pad 205 is secured to a platen 202 of the polishing system 200 using an adhesive, such as a pressure sensitive adhesive, disposed between the polishing pad 205 and the platen 202. A substrate carrier 208, facing the platen 202 and the polishing pad 205 mounted thereon, includes a flexible diaphragm 211 configured to impose different pressures against different regions of a substrate 210 while urging the substrate 210 to be polished against the polishing surface of the polishing pad 205. The substrate carrier 208 includes a carrier ring 209 surrounding the substrate 210. During polishing, a downforce on the carrier ring 209 urges the carrier ring 209 against the polishing pad 205 thereby preventing the substrate 210 from slipping from the substrate carrier 208. The substrate carrier 208 rotates about a carrier axis 214 while the flexible diaphragm 211 urges the to be polished surface of the substrate 210 against the polishing surface of the polishing pad 205. The platen 202 rotates about a platen axis 204 in an opposite rotational direction from the rotation direction of the substrate carrier 208 while the substrate carrier 208 sweeps back and forth from a center region of the platen 202 to an outer diameter of the platen 202 to, in part, reduce uneven wear of the polishing pad 205. Herein, the platen 202 and the polishing pad 205 have a surface area that is greater than the to be polished surface area of the substrate 210, however, in some polishing systems, the polishing pad 205 has a surface area that is less than the to be polished surface area of the substrate 210. An endpoint detection (EPD) system 230 directs light towards the substrate 210 through a platen opening 222 and further through an optically transparent window feature 206 of the polishing pad 205 disposed over the platen opening 222.

During polishing, a fluid 216 is introduced to the polishing pad 205 through a fluid dispenser 218 positioned over the platen 202. Typically, the fluid 216 is a polishing fluid (including water as a polishing fluid or a part of the polishing material), a polishing slurry, a cleaning fluid, or a combination thereof. In some embodiments, the fluid 216 is a polishing fluid comprising a pH adjuster and/or chemically active components, such as an oxidizing agent, to enable chemical mechanical polishing of the material surface of the substrate 210 in conjunction with the abrasives of the polishing pad 205.

Figure 3:
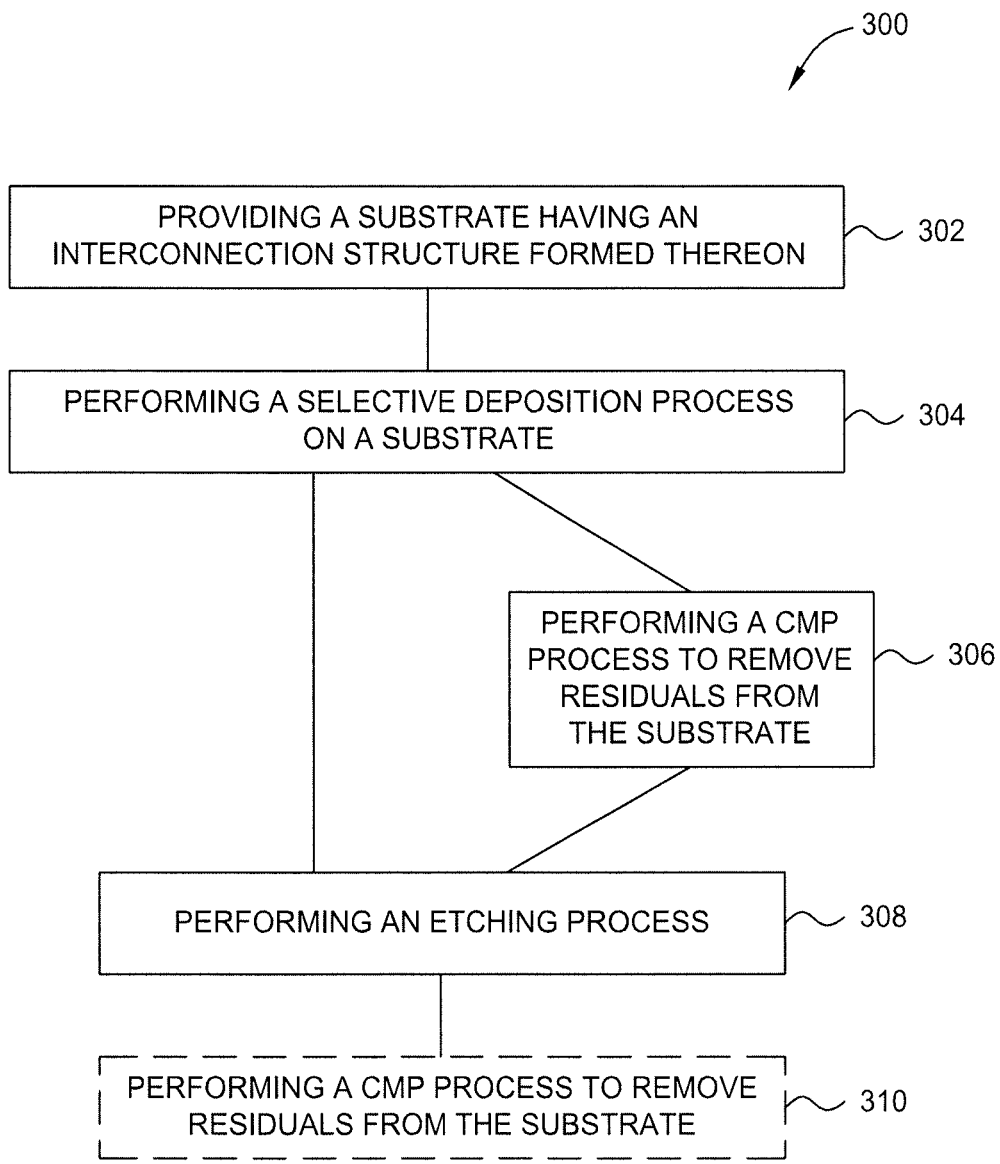
FIG. 3 is a flowchart of a method for performing a residual removal process according to one or more embodiments of the present disclosure.
Figure 4A:
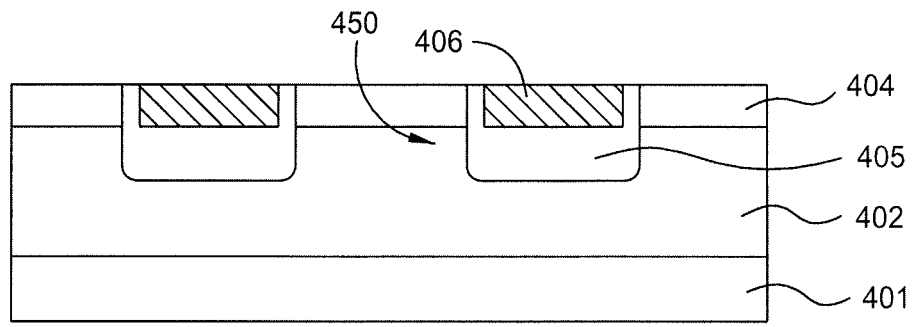
FIGS. 4A-4C illustrate cross sectional view of a substrate during the patterning process of FIG. 3.

FIG. 3 is a flow diagram of one example of a method 300 for removing residuals from a substrate. The method 300 begins at operation 302 by performing a substrate having an interconnection structure 450 formed thereon, as shown in FIG. 4A. In one example, the interconnection structure 450 may be utilized in a back-end or front-end structure for forming semiconductor devices. In the example depicted in FIG. 4A, the interconnection structure 450 may include a glue material 405 and a capping layer 406 formed in an insulating material 402 and a interfacial layer 404. It is noted that the interconnection structure 450 may be any structures, including front-end structures or gate structures utilized for forming semiconductor devices.

In one example, the substrate 401 may include materials selected from a group consisting of crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 401 may have various dimensions, such as 200 mm, 300 mm, 450 mm or other diameter, as well as, being a rectangular or square panel. Unless otherwise noted, embodiments and examples described herein are conducted on substrates with a 200 mm diameter, a 300 mm diameter, or a 450 mm diameter substrate. In the embodiment wherein a SOI structure is utilized for the substrate 401, the substrate 401 may include a buried dielectric layer disposed on a silicon crystalline substrate. In the embodiment depicted herein, the substrate 401 may be a crystalline silicon substrate. Moreover, the substrate 401 is not limited to any particular size or shape. The substrate 401 may be a round substrate having a 200 mm diameter, a 300 mm diameter or other diameters, such as 450 mm, among others. The substrate 401 may also be any polygonal, square, rectangular, curved or otherwise non-circular workpiece, such as a polygonal glass substrate used in the fabrication of flat panel displays.

Although the example depicted in FIG. 4A shown that the interconnection structure 450 is formed on the substrate 401, it is noted that there may be further structures formed between the interconnection structure 450 and the substrate 401 as needed. In one example, a front-end structure, such as a gate structure and/or a contact structure may be formed between the interconnection structure 450 and the substrate 401 to enable functions of the semiconductor devices.

In one example, the insulating material 402 included in the interconnection structure 450 may be a dielectric material, such as silicon oxide material, silicon containing materials, doped silicon materials, low-k material, such as carbon containing materials. Suitable carbon containing materials include amorphous carbon, SiC, SiOC, doped carbon materials or any suitable materials. Suitable examples of the low-k insulating dielectric material includes SiO containing materials, SiN containing materials, SiOC containing materials, SiC containing materials, SiOCN containing materials, carbon based materials, or other suitable materials. In one example, the insulating material 402 is a SiN layer.

The insulating material 402 may be formed by a plasma enhanced chemical vapor deposition (CVD), a flowable chemical vapor deposition (CVD), a high density plasma (HDP) chemical vapor deposition (CVD) process, atomic layer deposition (ALD), cyclical layer deposition (CLD), physical vapor deposition (PVD), or the like as needed.

The interfacial layer 404 is disposed on the insulating material 402 adjacent to the capping layer 406 with the glue material 405 surrounding the capping layer 406. The interfacial layer 404 is also an insulative material, e.g., a dielectric material, such as a silicon containing material. Suitable examples of the interfacial layer 404 include SiN, SiON, SiO$_2$, SiOC, SiOCN, SiCN and the like. In one example, the interfacial layer 404 is a SiON layer.

The glue material 405 in the insulating material 402 and vertically extending to the interfacial layer 404 may be formed by a metal containing material, such as TiN, TaN, WN or the like. The capping layer 406 is a metal material, such as tungsten (W), tantalum (Ta), titanium (Ti), copper (Cu), ruthenium (Ru), nickel (Ni), cobalt (Co), chromium (Cr), iron (Fe), manganese (Mn), aluminum (Al), hafnium (Hf), vanadium (V), molybdenum (Mo), palladium (Pd), gold (Au), silver (Au), platinum (Pt), alloys thereof, and combinations thereof, among others. In one particular example, the capping layer 406 is a ruthenium (Ru), cobalt (Co), or a tungsten (W) layer. In one specific example, the capping layer 406 is a ruthenium (Ru) layer.

The capping layer 406 and the interfacial layer 404 are exposed ready to receive another material formed thereon.

Figure 4B:
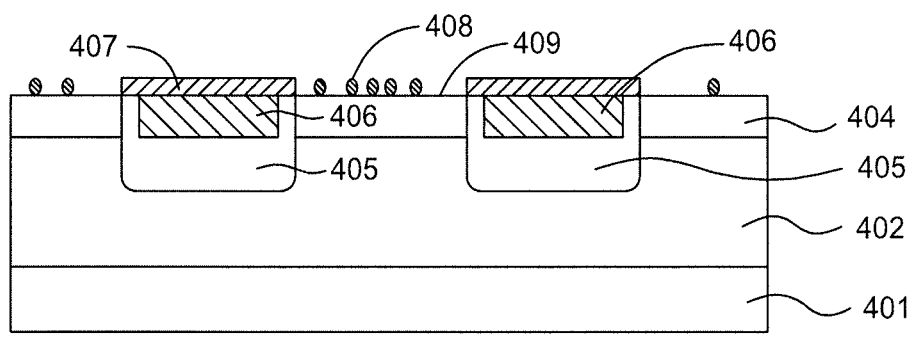

At operation 304, a selective deposition process is performed on a substrate 401. The selective deposition process at operation 304 is performed to form a metal containing dielectric material 407 on the capping layer 406, as shown in FIG. 4B. The selective deposition process is performed to selectively form the metal containing dielectric material 407 on the capping layer 406, as shown in FIG. 4B. The selective deposition process performed is performed to predominantly form the metal containing dielectric material 407 with compatible film qualities and characteristics to materials from the capping layer 406, but not to the interfacial layer 404 on the insulating material 402. As a result, the metal containing dielectric material 407 is selectively and predominately formed on the capping layer 406, rather than on the interfacial layer 404 or globally formed across the substrate 401, including some surfaces of the insulating material at other locations, if any.

The metal containing dielectric material 407 may be a high dielectric contact material having a dielectric constant greater than 10. Suitable examples of the metal containing dielectric material 407 include metal dielectric materials hafnium containing oxide (HfO$_x$), AlN, WSiO$_2$, WSi, AlON, TiN, TaN, TlON, TaON, zirconium oxide (ZrO$_x$), titanium oxide (TiO$_x$), tantalum oxide (TaO$_x$), niobium oxide (NbO$_x$), iron oxide (FeO$_x$), yttrium oxide (YO$_x$), aluminum oxide (AlO$_x$) and the like. In one particular example, the metal containing dielectric material 407 is hafnium containing oxide (HfO$_x$) or Al$_2$O$_3$.

In one example, the selective deposition process may be an ALD process, CVD process, or any suitable deposition process. In one example depicted herein, the selective deposition process is an atomic layer deposition process (ALD).

In some instances, some residuals 408 and/or leftovers of the metal containing dielectric material 407 may adversely remain on the undesired locations, such as on the surface 409 of the interfacial layer 404. Such residuals 408 may contaminate the substrate surface, and eventually lead to device failure. Thus, in most of the situations, the metal containing dielectric material 407 and the residuals 408 are similar or the same materials. In one example, the residuals 408 are also a high dielectric contact material having a dielectric constant greater than 10. Suitable examples of the metal containing dielectric material 407 include metal dielectric materials hafnium containing oxide (HfO$_x$), AlN, WSiO$_2$, WSi, AlON, TiN, TaN, TiON, TaON, zirconium oxide (ZrO$_x$), titanium oxide (TiO$_x$), tantalum oxide (TaO$_x$), niobium oxide (NbO$_x$), iron oxide (FeO$_x$), yttrium oxide (YO$_x$), aluminum oxide (AlO$_x$) and the like. In one particular example, the metal containing dielectric material 407 and the residuals 408 are both hafnium containing oxide (HfO$_x$) or Al$_2$O$_3$.

Figure 4C:
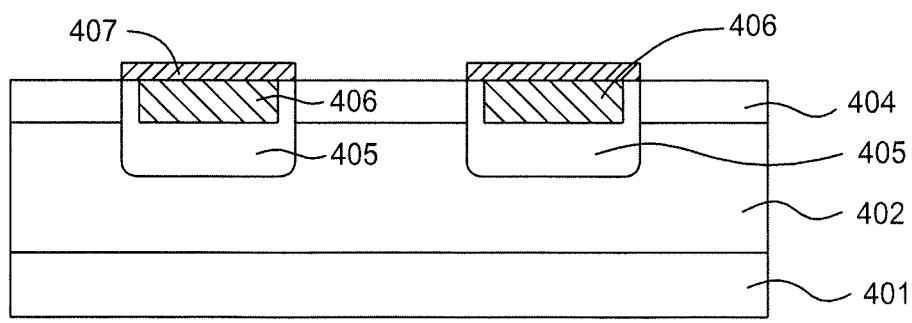

At an optional operation 306, a CMP process may be performed to remove the residuals 408 from the surface 409 of the interfacial layer 404, as shown in FIG. 4C. The CMP process as performed may remove the residuals 408 from the surface 409 of the interfacial layer 404 without adversely damaging or over-polishing the nearby metal containing dielectric material 407. The residuals 408 remaining on the substrate 401 have relatively loose bonding structure to the surface 409 of the interfacial layer 404, as compared to the bonding structures in the metal containing dielectric material 407. Thus, by using relatively minimum polishing downforce, the residuals 408 on the substrate 401 may be removed, without damaging or polishing away material from the metal containing dielectric material 407.

In one example, the residuals 408 are removed by a CMP apparatus, such as the polishing system 200 depicted in FIG. 2. The polishing system 200 can perform a chemical mechanical process at a relatively reduced/mild removal rate in order to prevent excess metal removal to the metal containing dielectric material 407, thus, selectively removing the residuals 408 from the substrate 401.

The chemical mechanical polishing process may remove or polish the residuals 408 from the substrate 401 by using a specific fluid supplied during the polishing process, or by DI water. A relatively soft polishing pad, such as a pad having elasticity greater 90% may be used to during the chemical mechanical polishing process. During polishing, as the polishing pad selected has a relatively soft surface, thus, slurry or other chemical fluid may be eliminated as needed. In one example, DI water may be utilized during the chemical mechanical polishing process. The chemical mechanical polishing process is followed by a cleaning process as needed to enhance the cleanliness of the substrate surface.

At operation 308, an etching process is performed to remove residuals 408 from the substrate 401, as shown in FIG. 4C, with or without the optional CMP process performed at operation 306. The etching process is performed to selectively remove the residuals 408 from the substrate 401 without damaging the metal containing dielectric material 407. The etching process is performed in the processing chamber, such as the processing chamber 100 of FIG. 1, to predominately and selectively remove the residuals 408.

The etching process at operation 308 is performed by supplying an etching gas mixture to the substrate 401 in the processing chamber 100 to predominately and selectively remove the residuals 408 without damaging the metal containing dielectric material 407. In one example, the etching gas mixture includes at least a halogen containing gas. Suitable examples of the halogen containing gas include $BCl_3$, $Cl_2$, $NF_3$, $CF_4$, HCl, HBr, $Br_2$, combinations thereof and the like. Inert gas, such as He and Ar, may also be supplied in the etching gas mixture. In some example, carrier gases, such as $N_2$, $O_2$, $CO_2$, $N_2O$, $NO_2$ and the like, may also be supplied in the etching gas mixture. In one particular example, the etching gas mixture includes $BCl_3$, $Cl_2$, and Ar or $BCl_3$, $NF_3$, and Ar.

Figure 5:
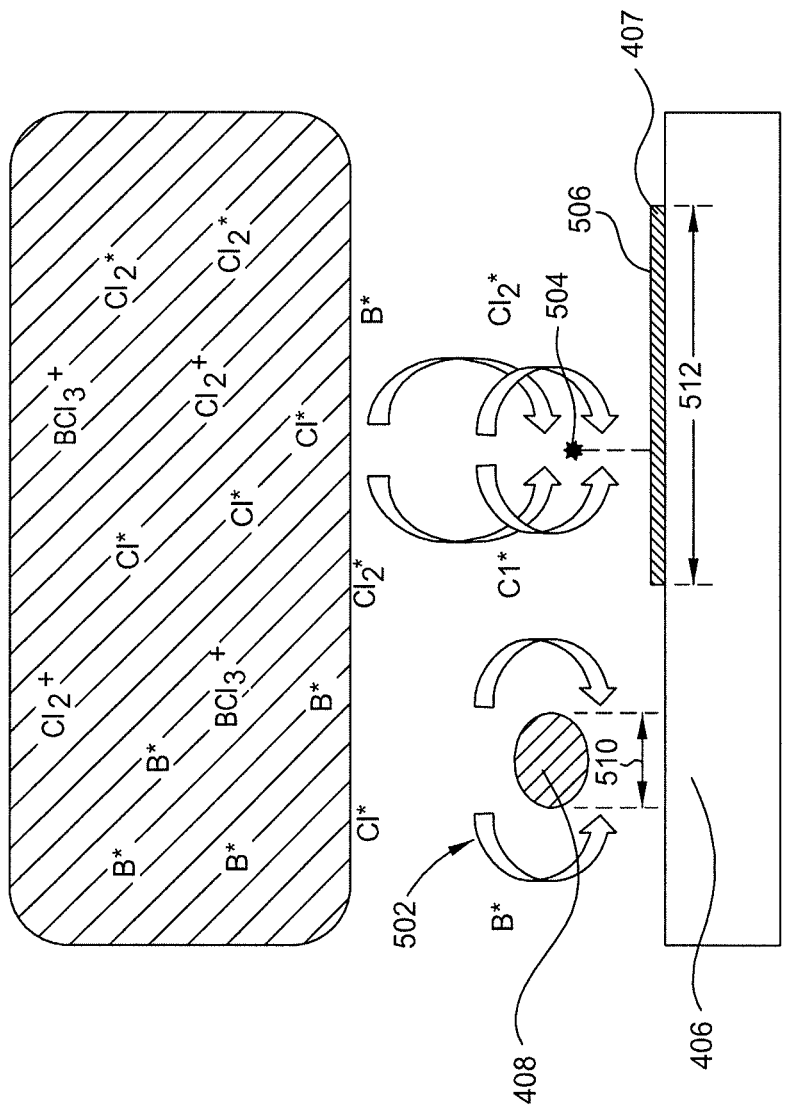
FIG. 5 depicts a cross sectional view of a substrate during the patterning process of FIG. 3.

It is believed that the different geometrical configurations between the residuals 408 and the metal containing dielectric material 407 provide different etching mechanisms and behavior during the etching process at operation 308. Thus, by utilizing the structures with different geometrical configurations on the substrate, a selective etching process may be obtained. Different geometrical configurations between the residuals 408 and the metal containing dielectric material 407 provide different etching surface areas that allow different amounts of the etching species to be in contact with the residuals 408 and the metal containing dielectric material 407 respectively. For example, the residuals 408 often have a round, oval, circular or irregular shapes while the metal containing dielectric material 407 often has a longitudinal bulk structure. FIG. 5 depicts one embodiment of the reaction mechanism of the etching gas mixture to the residuals 408 and to the metal containing dielectric material 407. As the round, oval, circular shapes of the residuals 408 provide a greater surface area, as compared to the metal containing dielectric material 407, more reactive species from the etching gas mixture are able to react and expose to the residuals 408, thus forming the volatile by-product to be removed from the substrate surface (e.g. pumped out from the processing chamber). The greater surface area of the reaction from the residuals 408 provides a relatively higher etching/removal rate, so that the residuals 408 can be removed from the substrate 401 at an etching/removal rate greater than the metal containing dielectric material 407. As a result, a selective etching process is obtained to selectively remove the residuals 408 from the substrate 401 without damaging or overly attacking the metal containing dielectric material 407. As shown in FIG. 5, the round, oval, circular shapes of the residuals 408 allow the reactive etchants to travel around the perimeter of the residuals 408, as indicated by the arrow 502. In contrast, the bulk structure of the metal containing dielectric material 407 has a relatively strong bonding structure and has only the top surface 506 exposed for reaction. Thus, the reactive species from the etching gas mixture preferentially react with the dangling bonds or residuals 504, which as relatively weak bonding structures, from the top surface 506 of the metal containing dielectric material 407. Thus, the etching/removal rate at the top surface 506 of the metal containing dielectric material 407 is relatively slower than the etching/removal rate at the outer perimeter of the residuals 408, thus providing the desired selective etching process predominately on the area where the residuals 408 are located.

In one example, the etching gas mixture includes $BCl_3$, $Cl_2$, and Ar. During etching, the $BCl_3$ gas and $Cl_2$ gas are dissociated into B* and Cl* reactive species, such as ions or radicals, for reaction. It is believed that the chlorine reactive species (e.g., Cl*) may react with the residuals 408, which is also a metal containing dielectric material, from the substrate 401 without aggressively attacking the metal containing dielectric material 407. In one example, the residuals 408 include hafnium containing oxide ($HfO_x$), such as $HfO_2$ material. The chlorine reactive species (e.g., Cl*) can efficiently react with the $HfO_2$ material, removing the residuals 408 from the substrate. In another example, the etching gas mixture includes $BCl_3$, $NF_3$, and Ar. The fluorine reactive species (e.g., F*) may also efficiently react with the $HfO_2$ material, removing the residuals 408 from the substrate. Thus, the chlorine and fluorine reactive species (e.g., Cl* and F*) are both good species to react with $HfO_2$ material so as to efficiently remove the residuals 408 from the substrate 401.

In one example, the residuals 408 have a diameter 510 less than 30 nm but greater than 2 nm, such as between about 12 nm and about 25 nm, or between about 9 nm and about 10 nm. The metal containing dielectric material 407 has a width 512 of greater than 50 nm, such as between about 80 nm and about 90 nm.

During the supplying of the etching gas mixture at operation 308, several process parameters may be controlled. In one embodiment, the a RF source power may be supplied to the plasma processing chamber 100 between about 100 Watts and about 3000 Watts, such as about 300 Watts, with or without RF bias power. When the RF bias power is utilized, the RF bias power may be controlled at between about 1 Watts and about 500 Watts. The pressure of the processing chamber may be controlled at a pressure range greater than 2 mTorr but less than 500 mTorr, such as between about 5 mTorr and about 200 mTorr, such as about 150 mTorr. The substrate pedestal may be maintained between from 0 degrees Celsius up to 250 degrees Celsius, such as between 50 degrees Celsius and about 100 degrees Celsius, for example about 90 degrees Celsius.

After the residuals 408 are removed from the substrate 401, a relatively clean surface is obtained after the selective deposition process to selectively form the metal containing dielectric material 407 on the substrate with relatively no residuals 408 on the substrate 401, as shown in FIG. 4C.

At an optional operation 310, after the etching process at operation 308, if there is still are any residuals or leftover materials requiring removal from the substrate 401, an additional CMP process may be performed to enhance the removal efficiency and performance. The CMP process performed at operation 310 is similar to the CMP process performed at operation 306.

Thus, methods for removing residuals after a selective deposition process are provided. The methods utilize an etching gas mixture including at least one halogen containing gas to remove residuals. The residuals may include hafnium containing oxide ($HfO_x$), such as $HfO_2$ material. A CMP process may be optionally performed prior to or after the etching process to enhance the residual removal performance and efficiency.

While the foregoing is directed to embodiments of the present disclosure, other and further embodiments of the disclosure may be devised without departing from the basic scope thereof, and the scope thereof is determined by the claims that follow.

We claim:

1. A method for removing residuals from a substrate, comprising:

performing a selective deposition process to form a metal containing dielectric material at a first location of a substrate, the first location comprises a surface of a capping layer and a surface of an adhesive layer, the capping layer embedded in the adhesive layer, the adhesive layer embedded in an insulting layer disposed on the substrate; and performing a residual removal process to remove residuals from a second location of the substrate.

2. The method of claim 1, wherein the residual removal process is a chemical mechanical polish process.

3. The method of claim 1, wherein the residual removal process further comprises:

performing an etching process.

4. The method of claim 3, wherein performing an etching process further comprises:

supplying an etching gas mixture onto a surface of the substrate, wherein the etching gas mixture includes at least a halogen containing gas.

5. The method of claim 4, wherein a halogen containing gas is selected from a group consisting of $BCl_3$, $Cl_2$, $NF_3$, $CF_4$, HCl, HBr, $Br_2$ and combinations thereof.

6. The method of claim 5, wherein the etching gas mixture includes $BCl_3$ $Cl_2$ or $NF_3$.

7. The method of claim 1, wherein the residual has a diameter less than 30 nm but greater than 2 nm.

8. The method of claim 1, further comprising:

performing a CMP process after the residual removal process.

9. The method of claim 1, wherein the metal containing dielectric material and the residuals comprises the same material.

10. The method of claim 1, wherein the metal containing dielectric layer is a high dielectric constant material having a dielectric constant greater than 12.

11. The method of claim 1, wherein the metal containing dielectric layer is fabricated from a material selected from a group consisting of hafnium containing oxide ($HfO_x$), AlN, $WSiO_2$, WSi, AlON, TiN, TaN, TiON, TaON, zirconium oxide ($ZrO_x$), titanium oxide ($TiO_x$), tantalum oxide ($TaO_x$), niobium oxide ($NbO_x$), iron oxide ($FeO_x$), yttrium oxide ($YO_x$) and aluminum oxide ($AlO_x$).

12. The method of claim 9, wherein the metal containing dielectric material and the residuals are both hafnium containing oxide.

13. The method of claim 1, wherein the capping layer is selected from a group consisting of ruthenium (Ru), cobalt (Co), and tungsten (W).

14. The method of claim 1, wherein the second location of the substrate comprises a dielectric material.

15. A method for removing residuals from a substrate, comprising:

performing a selective deposition process to form a metal containing dielectric material on a metal material on a substrate and leaving residuals on a dielectric material on the substrate, the metal material formed on a surface of a capping layer and a surface of an adhesive layer, the capping layer embedded in the adhesive layer, the adhesive layer embedded in an insulting layer disposed on the substrate, wherein the metal containing dielectric material is a high dielectric constant material having a dielectric constant greater than 12; and performing a residual removal process to remove residuals from the substrate.

16. The method of claim 15, wherein the metal containing dielectric material is fabricated from a material selected from a group consisting of hafnium containing oxide ($HfO_x$), AlN, $WSiO_2$, WSi, AlON, TiN, TaN, TiON, TaON, zirconium oxide ($ZrO_x$), titanium oxide ($TiO_x$), tantalum oxide ($TaO_x$), niobium oxide ($NbO_x$), iron oxide ($FeO_x$), yttrium oxide ($YO_x$) and aluminum oxide ($AlO_x$).

17. The method of claim 15, wherein the residual removal process is a CMP process or an etching process.

18. The method of claim 15, wherein the residual has a diameter less than 30 nm but greater than 2 nm.

19. A method for removing residuals from a substrate, comprising:

performing a selective deposition process by an atomic layer deposition process to form a metal containing dielectric material on a metal material on a substrate and leaving residuals on a dielectric material on the substrate, the metal material is formed on a surface of a capping layer and a surface of an adhesive layer, the capping layer embedded in the adhesive layer, the adhesive layer embedded in an insulting layer disposed on the substrate; and performing a residual removal process to remove residuals from the substrate wherein the residual has a diameter less than 30 nm but greater than 2 nm.

* * * * *